US005550332A

United States Patent [19]

Sakamoto

[11] Patent Number: 5,550,332

[45] Date of Patent: Aug. 27, 1996

[54] LOUDSPEAKER ASSEMBLY

[75] Inventor: Yoshio Sakamoto, Hachioji, Japan

[73] Assignee: Kabushiki Kaisha Kenwood, Japan

[21] Appl. No.: 570,379

[22] Filed: Dec. 11, 1995

Related U.S. Application Data

[63] Continuation of Ser. No. 370,464, Jan. 9, 1995, abandoned, which is a continuation of Ser. No. 135,973, Oct. 14, 1993, abandoned.

[30] Foreign Application Priority Data

Oct. 20, 1992 [JP] Japan .................................... 4-281321

[51] Int. Cl.$^{6}$ ............................ H05K 5/00; H04R 25/00

[52] U.S. Cl. ............................................ 181/148; 381/199

[58] Field of Search ............................ 181/148; 381/199, 381/192, 195, 200, 201

[56] References Cited

U.S. PATENT DOCUMENTS 4,783,824 11/1988 Kobayashi .......................... 381/199 X
5,142,260 8/1992 House ................................ 381/199 X

FOREIGN PATENT DOCUMENTS 0503860 9/1992 European Pat. Off. .
3730305 3/1989 Germany .

OTHER PUBLICATIONS

Journal of the Audio Engineering Society, vol. 29, No. 1/2, Jan. 1981, New York, US, pp. 10–26, Mark R. Gander "Moving–Coil Loudspeaker Topology as an Indicator of Linear Excursion Capability".

Abstract of JP 59148500, Aug. 25, 1984.

*Primary Examiner*—Michael L. Gellner
*Assistant Examiner*—Eddie C. Lee
*Attorney, Agent, or Firm*—Sixbey, Friedman, Leedom & Ferguson; Gerald J. Ferguson, Jr.; Karlton C. Butts

[57] ABSTRACT

A loudspeaker assembly for low frequency reproduction having a good vibration efficiency for a large vibration amplitude and a small magnetic distortion. Two magnets magnetized in the direction of thickness have the magnetic poles of the same polarity disposed facing each other with a center plate made of soft magnetic material being interposed therebetween. Magnetic fluxes extend from the outer periphery (positive side) of the center plate and return to the top and bottom surfaces (negative side) of the two magnets. The winding width of a voice coil is set equal to or greater than a width between two transition points of the magnetic flux distribution from the positive side to the negative side.

2 Claims, 4 Drawing Sheets

LOUDSPEAKER ASSEMBLY

This application is a Continuation of Ser. No. 08/370,464 filed Jan. 9, 1995; which itself is a continuation of Ser. No. 08/135,973 filed Oct. 14, 1993, both now abandoned.

BACKGROUND OF THE INVENTION

1. Field of the Invention

The present invention relates to a loudspeaker assembly in which a voice coil is driven by a magnetic field (hereinafter called repulsive magnetic field) generated by a magnetic circuit (hereinafter called repulsive magnetic circuit) having two magnets which are magnetized in the direction of thickness and the magnetic poles of the same polarity are faced with each other with a center plate being interposed therebetween.

2. Related Background Art

A conventional loudspeaker has the magnetic characteristics and the structure such as shown in FIGS. 5 and 6.

FIG. 5 explains the magnetic flux distribution and the directions of lines of magnetic force, respectively of a magnetic circuit of a repulsive magnetic type loudspeaker. FIG. 6 is a cross sectional view showing the structure of a conventional loudspeaker.

A repulsive magnetic circuit has been considered not suitable for driving a voice coil 1*c* of a loudspeaker of the type that the diaphragm is driven at a large vibration amplitude, because of the magnetic characteristics specific to this magnetic circuit. As seen from the magnetic flux distribution of the magnetic circuit shown in FIG. 5, magnetic fluxes are guided from the magnetic poles of the same polarity (N pole) facing each other into a center plate P interposed between the two magnets M1 and M2, extend from the outer periphery of the center plate P, and immediately flow toward the opposite magnetic poles (S pole).

Also in the case where an outer ring L or the like of magnetic material is disposed outside of the center plate P to form a magnetic gap therebetween, although a portion of magnetic fluxes extending from the outer periphery of the center plate P directly flows toward the opposite magnetic poles (S pole), most of the magnetic fluxes pass through the outer ring L and thereafter immediately flow toward the opposite magnetic poles (S pole).

Therefore, the magnetic flux distribution of this magnetic circuit provides a pattern as in the following. Namely, the magnetic flux density at the voice coil is great near the center plate P, decreases at the positions higher and lower than the position of the center plate P, becomes "0" at the position approximately ⅓ to ½ of the thickness of each magnet, increases at the positions higher and lower than the "0" point position with the direction of magnetic fluxes being reversed, takes a negative side maximum value at the positions corresponding to the top and bottom surfaces of the two magnets, and decreases toward "0" as the positions become higher and lower from the maximum positions.

The voice coil 1*c* vibrates in the upward and downward directions as viewed in FIG. 6 to drive a diaphragm 6 and produce sounds. As the voice coil 1*c* for driving a low frequency loudspeaker or woofer, a so-called long voice coil is used as shown in FIGS. 5 and 6 in order to improve the amplitude efficiency at the low frequency band. Generally, such a long voice coil 1*c* has a winding width about two to three times wider than the thickness of the center plate P or top plate T.

However, although sufficient magnetic fluxes cross the voice coil 1*c* near at the center plate P to drive it, the negative side magnetic fluxes suppressing the normal motion of the voice coil 1*c* are present at the positions higher and lower than the center plate P.

Specifically, the long voice coil 1*c* in the repulsive magnetic circuit receives the magnetic fluxes near at the center plate P at the central area of the coil. However, at the other area near at the top and bottom surfaces of the magnets, the voice coil 1*c* enters the negative side magnetic flux distribution region. Therefore, the total magnetic fluxes for driving the voice coil 1*c* decrease, lowering the sound pressure.

As described above, as a voice coil for driving a woofer, a long voice coil has been conventionally used in order to improve the amplitude efficiency at the low frequency band. Generally, such a long voice coil has a winding width about two to three times wider than the thickness of the top plate.

However, although sufficient magnetic fluxes cross the voice coil near at the center plate to drive it, the negative side (opposite direction) magnetic fluxes suppressing the normal motion of the voice coil are present at the positions higher and lower than the center plate.

Therefore, the long voice coil receives the magnetic fluxes near at the center plate P at the central area of the coil. However, at the other area near at the top and bottom surfaces of the magnets, the voice coil enters the negative side magnetic flux distribution region. Therefore, the total magnetic fluxes for driving the voice coil decrease, lowering the sound pressure.

SUMMARY OF THE INVENTION

It is therefore an object of the present invention to solve the above problems and provide a loudspeaker assembly for low frequency reproduction having a good vibration efficiency for a large vibration amplitude and a smaller magnetic distortion.

According to one aspect of the present invention, there is provided a loudspeaker assembly for driving a voice coil by a magnetic field generated by a magnetic circuit having two magnets which are magnetized in the direction of thickness and has the magnetic poles of the same polarity faced with each other with a center plate made of magnetic material being interposed therebetween, wherein the winding width of the voice coil is set equal to or greater than a width between two transition points of the magnetic flux distribution of the magnetic circuit from a positive side to a negative side.

The winding width of the voice coil is preferably set less by 10% to 20% than the width between the two transition points.

According to the present invention, the winding width of a voice coil is set to equal to or greater than the width between two transition points of the magnetic flux distribution shown in FIG. 5. Therefore, an adverse effect of the negative side magnetic flux region hardly occurs even during the low frequency band reproduction when the voice coil is driven at a large amplitude.

DETAILED DESCRIPTION OF THE PREFERRED EMBODIMENTS

Embodiments of a loudspeaker assembly according to the present invention will be described with reference to FIGS. 1 to 5. Like elements to those of a conventional loudspeaker are indicated by using identical reference representations, and the description thereof is omitted.

Figure 1:
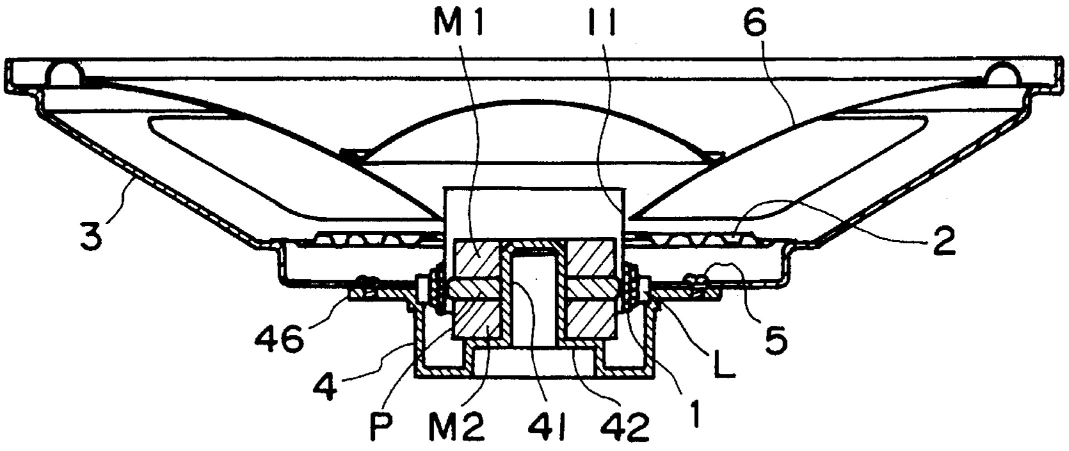
FIG. 1 is a cross section showing the structure of a loudspeaker according to an embodiment of the present invention.
Figure 2A:
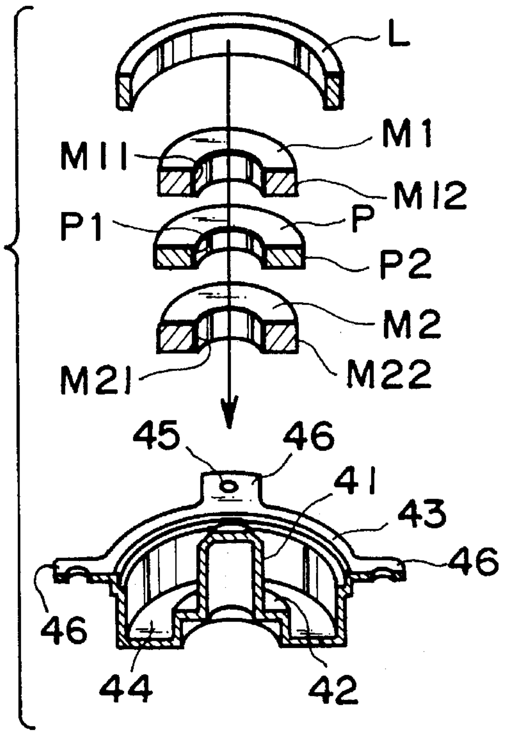
FIG. 2A is a broken perspective view partially in section showing the structure of a magnetic circuit according to the present invention.
Figure 2B:
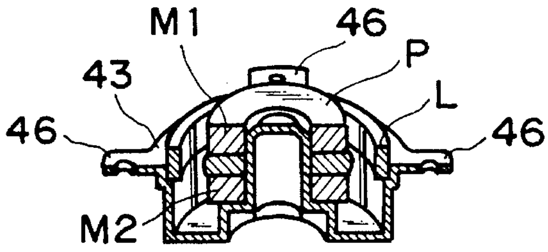
FIG. 2B is a perspective view partially in section showing the structure of the magnetic circuit shown in FIG. 2A.
Figure 3A:
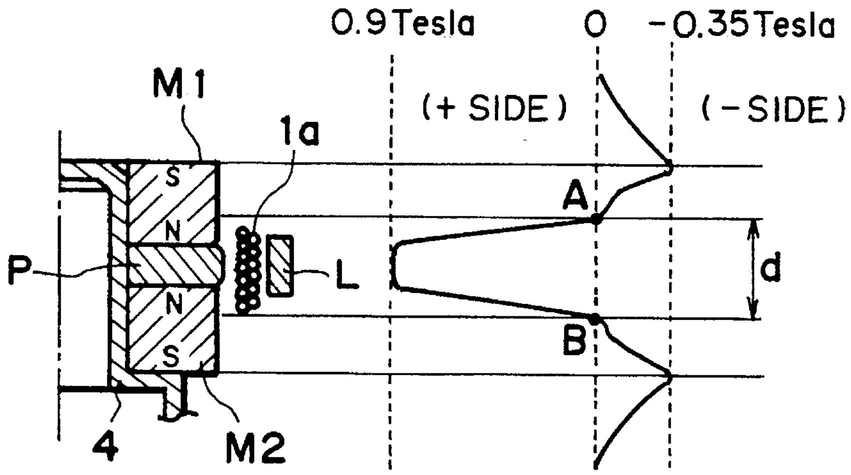
FIGS. 3A to 3C are cross sections showing the main parts of voice coil driving units and the diagrams showing magnetic flux distributions of magnetic circuits, respectively of loudspeakers (1), (2), and (3).
Figure 3B:
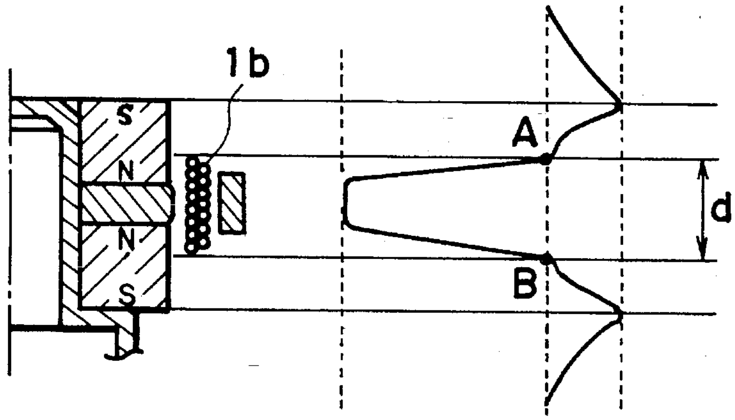
Figure 3C:
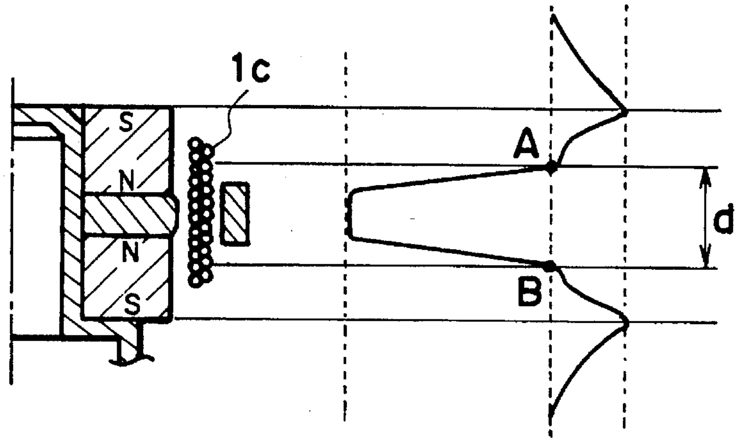
Figure 4:
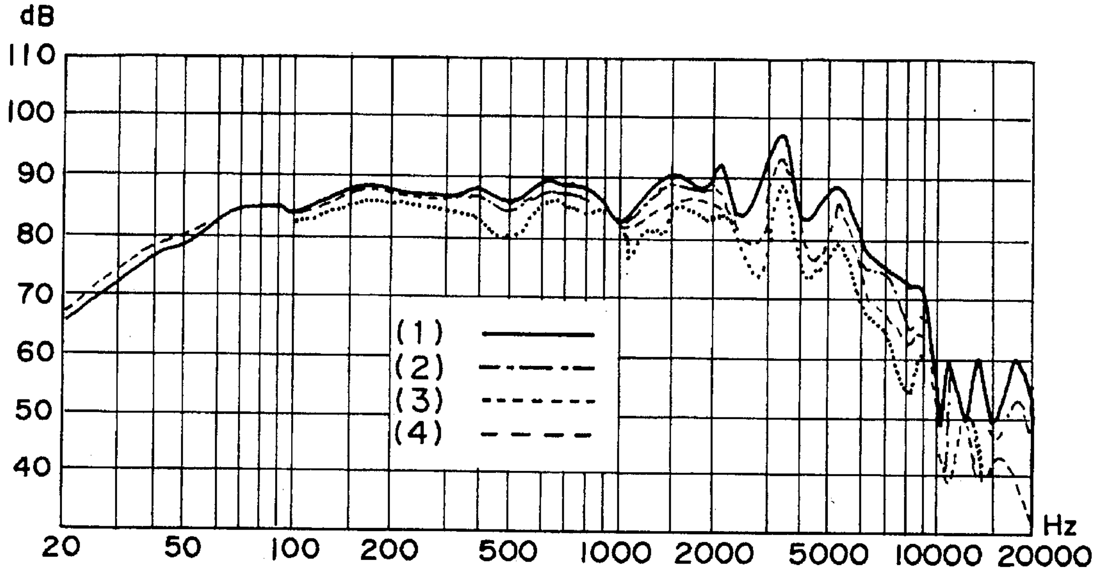
FIG. 4 is a graph comparing the characteristics of embodiment loudspeakers and a conventional loudspeaker.
Figure 5:
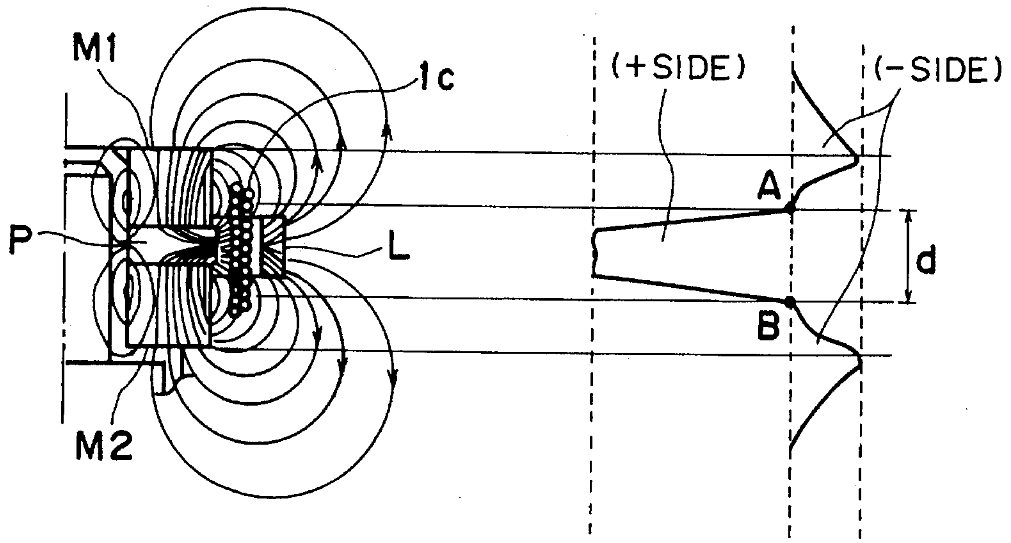
FIG. 5 illustrates the magnetic flux distribution and the direction of magnetic fluxes of a repulsive magnetic circuit.

FIG. 1 is a cross section showing the structure of a loudspeaker according to an embodiment of the present invention. FIG. 2A is a broken perspective view partially in section showing the structure of a magnetic circuit according to the present invention, and FIG. 2B is a perspective view partially in section showing the structure of the magnetic circuit. FIGS. 3A to 3C are cross sections of the main parts of voice coil driving units and the diagrams of magnetic flux distributions of magnetic circuits. In FIG. 3A, the width of the voice coil is set less than the transition point width, in FIG. 3B the width is set equal to the transition point width, and in FIG. 3C the width is set greater than the transition point width. FIG. 4 is a graph showing a comparison between embodiment loudspeakers and a conventional loudspeaker.

Loudspeakers of the embodiments are 8-inch woofers with a repulsion magnetic circuit. In the embodiments, magnets M1 and M2 are made of neodymium-based material, and of a ring shape having an outer diameter of 37.4 mm, an inner diameter of 15 mm, and a thickness of 9 mm. The magnets M1 and M2 were magnetized in the direction of thickness. An aluminum holder 4 shown in FIGS. 1, 2A, and 2B was formed to support the magnets M1 and M2, a center plate P, and an outer ring L.

A cylindrical center guide 41 is formed upright at the central area of the bottom 44 of the holder 4. A step 42 is formed at the lower end of the center guide 41 to properly match the total thickness of the magnets M1 and M2 and center plate P. Acrylic adhesive agent is coated on the surface of the step 42. The magnet M2 is inserted into the center guide 41 through the inner diameter space M21 by directing the N pole upward. The outer diameter of the center guide 41 was set to 15.95 mm.

Adhesive agent is coated on the upper surface of the inserted magnet M2. The center plate P is then fitted in the center guide 41 downward until the lower surface of the center plate P becomes in tight contact with the N pole surface of the magnet M2. The center plate P is made of ring iron having an outer diameter of 38.43 mm, an inner diameter of 15.95 mm, and a thickness of 6 mm. The edge portions at the inner diametrical periphery of the center plate P was beveled by C0.4. Adhesive agent is then coated on the upper surface of the fitted center plate P. The magnet M1 is inserted in the center guide 41 through the inner diameter space M11 by directing the N pole downward, until the magnet M1 becomes in tight contact with the upper surface of the center plate P. In this condition, the magnets M1 and M2 with their N poles facing each other interpose the center plate P therebetween, and the center plate outer circumference P2 extends by about 0.5 mm outside of the outer circumferences M12 and M22 of the magnets M1 and M2.

The outer ring L is then disposed outside of the center plate P to form a magnetic gap of 1.27 mm from the center plate P. The outer ring L is made of iron having an inner diameter of 40.97 mm, an outer diameter of 45 mm, and a height of 12 mm.

The magnetic flux distribution near at this magnetic gap is shown in FIG. 3. Positive side magnetic fluxes of about 0.9 tesla distribute over the width generally corresponding to the thickness of the center plate P. Magnetic fluxes gradually decrease at the positions higher and lower than that of the center plate P. In this embodiment, the magnetic flux density is "0" at the positions higher and lower by about 3 mm from the center plate P, i.e., at the positions about ⅓ the thickness of the magnet. The directions of magnetic fluxes become opposite to those near at the center plate P at the positions higher and lower than the "0" point. These negative side magnetic fluxes take a maximum value (–0.35 Tesla) at the positions corresponding to the top and bottom surfaces of the magnets. The magnetic fluxes gradually decrease to "0" value as the positions lower and rise from these maximum points.

This magnetic circuit on the holder 4 is mounted on a frame 3. To this end, the holder 4 is formed with a flange 43 having a width of about 2 mm and a thickness of 3 mm. The flange 43 is formed with four projections 46 extending outward at positions different by 90 degrees in the radial direction. A tap of about 5 mm is formed in the central area of each projection 46. After rubber-based adhesive agent is coated on the surface of the flange 43, the holder 4 is attached to the bottom of the frame 3. A mounting hole having a diameter of 5.5 mm is formed in the bottom of the frame at the position corresponding to each tap 45. The magnetic circuit on the holder 4 is fixed to the frame 3 by using screws 5 as shown in FIG. 1. The frame 3 has an outer diameter of about 215 mm and a depth of about 30 mm, which is commonly called an 8-inch frame made of a pressed iron frame having a thickness of 1.2 mm.

Voice coils 1 such as shown in FIGS. 3A to 3C are mounted on magnetic circuits. A voice coil **1*a* is wound on a bobbin 11 at its lower end portion. The bobbin 11 is made of an aluminum plate of 0.1 mm thickness. A coil wire is made of a copper wire of 0.21 mm diameter generally called 1PRESVW coated with insulating material. The winding width of the coil 1*a*** is about 10 mm and resistance is 3.4 ohms.

As shown in FIG. 3A, the voice coil **1*a* has a width less by 17% than the width d (about 12 mm) between the transition points A and B of the magnetic flux distribution of the repulsive magnetic circuit from the positive side to the negative side, i.e., between the magnetic flux 0** points A and B.

Vibration system components including a diaphragm 6 and a damper 2 were mounted on the assembly of the magnetic circuit and frame 3 to complete a loudspeaker (1). The characteristic of this loudspeaker (1) was measured, the result being indicated by a solid line in FIG. 4. The diaphragm 6 is made of pulp and has a conical shape with an outer diameter of about 194 mm (including an edge), a neck diameter of 39.6 mm, and a depth of about 27.8 mm. The damper 2 is of a general type made of cotton cloth or the like impregnated with phenol and formed with corrugations.

Another voice coil 1*c* has a d.c. resistance of 3.4 ohms same as the coil 1*a*, a different wire diameter, and a winding width d of about 16 mm which is greater than the width d between the transition points A and B. Another voice coil 1*b* has a winding width of 12 mm substantially the same as the width d between the transition points A and B.

Using the voice coils 1*c* and 1*b* and a diaphragm 6 and damper 2 similar to those described above, a loudspeaker (2) with the voice coil 1*b* and a loudspeaker (3) with the voice coil 1*c* were completed to measure the characteristics which are indicated by a fine one-dot-chain line and a fine broken line in FIG. 4.

Figure 6:
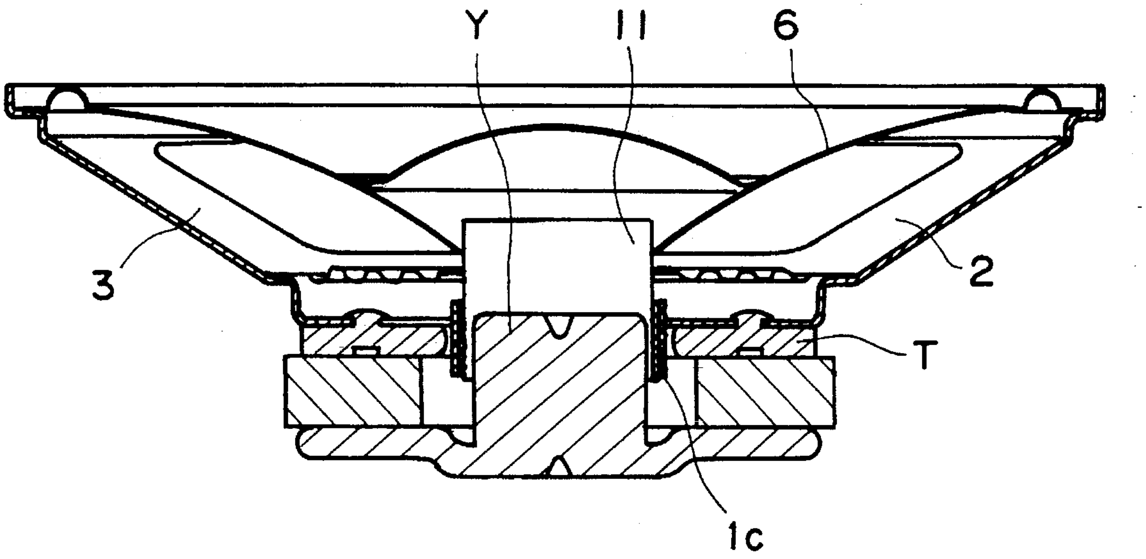
FIG. 6 PRIOR ART
FIG. 6 is a cross section showing the structure of a conventional loudspeaker.

Another loudspeaker (4) with a conventional general magnetic circuit shown in FIG. 6 different from the repulsive magnetic circuit was formed using a diaphragm 6 and damper 2 similar to those described above to measure the characteristics which are indicated by a thick broken line in FIG. 4. In this loudspeaker (4), the york pole Y has a diameter of 38.43 mm, and the top plate T has a thickness of 6 mm and an inner diameter of 40.97 mm, to thereby provide a magnetic gap of 1.27 mm. The magnet size was determined to provide a magnetic flux density of about 0.9 tesla similar to the embodiment repulsive magnetic circuits. The long voice coil has a winding width of 16 mm.

As compared with the loudspeaker (4) typical to conventional loudspeakers, the loudspeaker (3) with the voice coil 1*c* having the winding width of about 16 mm has a sound pressure level lower by 3 dB than the loudspeaker (4) over the whole frequency band, posing a practical problem.

The loudspeaker (1) with the voice coil 1*a* having the winding width less by about 17% than the width d between the transition points A and B poses no practical problem of a sound pressure at a low frequency band although the characteristics lower than a minimum resonance frequency differs slightly. The loudspeaker (2) with the voice coil 1*b* having the winding width of 12 mm substantially the same as the winding width d between the transition points A and B provides the characteristics sufficient for practical use although the sound pressure level lowers slightly as compared with the loudspeaker (4).

In summary, it is preferable to set the winding width of the voice coil less by 10 to 20% than the width d between the transition points A and B.

The magnetic flux distribution of the embodiment magnetic circuit depends upon the cross sectional shapes of the magnets, center plate, and outer ring. However, the winding width of the voice coil is set preferably to that described above, because the magnetic flux distribution will not change basically where the magnetic flux density becomes "0" near at the positions ⅓ to ½ the thickness of the magnet, and increases to the negative side at the positions higher and lower than the "0" point.

It is also preferable to set the winding width of the voice coil to that described above, for the loudspeaker of the type that the outer ring L made of soft magnetic material such as iron is not disposed outside of the center plate P, but soft magnetic material is used as the core or outer sheath of the wire of the voice coil. The reason for this is that the transition points A and B are basically the same positions.

According to the loudspeaker assembly of this invention, the magnetic flux distribution of the repulsive magnetic circuit is symmetrical relative to the positions at the voice coil, i.e., relative to the direction of driving the voice coil, thereby providing a symmetrical drive force of the diaphragm. This is extremely advantageous over a conventional general magnetic circuit wherein the magnetic flux distribution is asymmetrical relative to the positions at the voice coil.

By setting the winding width of the voice coil used with the repulsive magnetic circuit to the width substantially equal to or less than the width d between the transition points A and B, the adverse effect of the negative side magnetic flux region hardly occurs even during the low frequency reproduction where a woofer vibrates at a large amplitude, thereby providing the sound pressure characteristics such as indicated by the solid line (loudspeaker (1)) and by the one-dot-chain line (loudspeaker (2)) not so bad as compared with the conventional loudspeaker (1).

Accordingly, it is possible to manufacture a high performance woofer having a symmetrical magnetic flux distribution relative to the direction of driving the voice coil and having a smaller magnetic distortion.

What is claimed is:

1. A loudspeaker assembly for driving a voice coil with a winding width extending in a direction of voice coil movement, comprising:

- a magnetic circuit for generating a magnetic field having a magnetic flux distribution with two transition points from positive to negative field flux values, said transition points separated by a distance in a direction along the winding width, said circuit having two magnets which are magnetized in a direction of thickness thereof and arranged with said thicknesses in the direction of the winding width with magnetic poles of a same polarity facing each other; and
- a center plate made of magnetic material and having a thickness, said center plate arranged with said thickness between said two magnets,
- wherein said center plate has a diameter larger than diameters of the two magnets so as to project diametrically beyond the two magnets, and the winding width of said voice coil is greater than the thickness of the center plate, but smaller than said distance between said two positive-to-negative transition points of the magnetic flux distribution of said magnetic circuit.

2. A loudspeaker assembly according to claim 1, wherein said winding width of said voice coil is set less than said width between said two transition points by 10% to 20%.

* * * * *